US011239126B2

(12) United States Patent
Phun et al.

(10) Patent No.: US 11,239,126 B2
(45) Date of Patent: Feb. 1, 2022

(54) ROD-BASED SUBSTRATE WITH RINGED INTERCONNECT LAYERS

(71) Applicant: Intel Corporation, Santa Clara, CA (US)

(72) Inventors: Florence Su Sin Phun, Gelugor (MY); Wei Jern Tan, Georgetown (MY); Boon Ping Koh, Seberang Jaya (MY); Nik Mohamed Azeim Nik Zurin, Bayan Lepas (MY); Kai Chong Ng, Butterworth (MY)

(73) Assignee: INTEL CORPORATION, Santa Clara, CA (US)

( * ) Notice: Subject to any disclaimer, the term of this patent is extended or adjusted under 35 U.S.C. 154(b) by 234 days.

(21) Appl. No.: 16/487,194

(22) PCT Filed: Mar. 31, 2017

(86) PCT No.: PCT/US2017/025257
§ 371 (c)(1),
(2) Date: Aug. 20, 2019

(87) PCT Pub. No.: WO2018/182668
PCT Pub. Date: Oct. 4, 2018

(65) Prior Publication Data
US 2021/0074598 A1     Mar. 11, 2021

(51) Int. Cl.
*H01L 23/13*     (2006.01)
*H01L 21/48*     (2006.01)
(Continued)

(52) U.S. Cl.
CPC ............ *H01L 23/13* (2013.01); *H01L 21/481* (2013.01); *H01L 21/4846* (2013.01); *H01L 23/49838* (2013.01); *H01L 24/16* (2013.01); *H01L 24/17* (2013.01); *H01L 24/48* (2013.01); *H01L 25/18* (2013.01); *H01L 2224/16225* (2013.01); *H01L 2224/1703* (2013.01);
(Continued)

(58) Field of Classification Search
CPC .... H01L 23/13; H01L 21/481; H01L 21/4846
See application file for complete search history.

(56) References Cited

U.S. PATENT DOCUMENTS 5,122,674 A * 6/1992 Itou ...................... H03K 17/122
307/108
5,204,806 A * 4/1993 Sasaki .................... H05K 1/189
361/749
(Continued)

OTHER PUBLICATIONS

International Searching Authority, "Notification of Transmittal of the International Search Report and the Written Opinion of the International Searching Authority," dated Dec. 27, 2017, in International application No. PCT/US2017/025257.
(Continued)

Primary Examiner — Errol V Fernandes
(74) Attorney, Agent, or Firm — Trop, Pruner & Hu, P.C.

(57) ABSTRACT

An embodiment includes an apparatus comprising: a rod-shaped substrate including a rod long axis; a first layer, including a first interconnect, substantially surrounding the substrate in a first plane that is orthogonal to the rod long axis; and a second layer, including a second interconnect, substantially surrounding the first layer in the first plane. Other embodiments are described herein.

26 Claims, 12 Drawing Sheets

(51) Int. Cl.
*H01L 23/498* (2006.01)
*H01L 23/00* (2006.01)
*H01L 25/18* (2006.01)

(52) U.S. Cl.
CPC ............... *H01L 2224/48227* (2013.01); *H01L 2224/48235* (2013.01); *H01L 2924/15159* (2013.01)

(56) References Cited

U.S. PATENT DOCUMENTS

| | | | | |
|---|---|---|---|---|
| 6,392,143 | B1* | 5/2002 | Koshio | H01L 21/563 174/528 |
| 2004/0182265 | A1* | 9/2004 | Saiki | H01L 23/49827 101/366 |
| 2007/0276238 | A1 | 11/2007 | Sudol | |
| 2011/0254043 | A1 | 10/2011 | Negishi et al. | |
| 2012/0127660 | A1* | 5/2012 | Lee | H01L 25/0655 361/689 |
| 2013/0140528 | A1 | 6/2013 | De Kok et al. | |
| 2014/0146536 | A1 | 5/2014 | Li | |
| 2014/0197545 | A1 | 7/2014 | Chase et al. | |

OTHER PUBLICATIONS

Ajinomoto Fine-Techno Co., Inc., "Insulating Film 'ABF'," accessed Mar. 9, 2017, 4 pages, https://www.aft-website.com/en/electron/abf.
Wikipedia, "Printed Circuit Board," Mar. 9, 2017, 9 pages, https://en.wikipedia.org/wiki/Printed_circuit_board.
Wikipedia, "Via (electronics)," Mar. 9, 2017, 4 pages, https://en.wikipedia.org/wiki/Via_(electronics).
Wikipedia, "Radius of Curvature," Mar. 9, 2017, 5 pages, https://en.wikipedia.org/wiki/radius_of_curvature.
Wikipedia, "Flip Chip," Mar. 9, 2017, 4 pages, https://en.wikipedia.org/wiki/Flip_chip.
Wikipedia, "System In Package," Mar. 9, 2017, 2 pages, https://en.wikipedia.org/wiki/System_in_package.
Huemoeller, et al., "Unveiling The Next Generation In Substrate Technology", Pan Pacific Symposium Conference Proceedings, 2007, 10 pages.
Blackshear, et al., "The evolution of build-up package technology and its design challenges", IBM Journal of Research and Development, Jul. 2005, pp. 641-661, vol. 49, No. 4.5.
International Searching Authority, "International Preliminary Report on Patentability," dated Oct. 1, 2019, in International application No. PCT/US2017/025257.
Bernd Lange, "Microvia forming using UV laser," LPKF, Laser and Electronics, Date Unknown, 4 pages.

* cited by examiner

ROD-BASED SUBSTRATE WITH RINGED INTERCONNECT LAYERS

TECHNICAL FIELD

Embodiments of the invention are in the field of semiconductor packaging.

BACKGROUND

A semiconductor package provides a housing for a semiconductor chip or discrete device. The housing may provide physical and chemical protection for the chip or device and may dissipate heat generated by the chip or device. The package electrically interconnects the chip or device with outside circuitry by connecting the chip or device to a substrate, such as a multilayered ceramic substrate, printed circuit board (PCB), and the like. The substrate mechanically supports the chip or device and electrically connects to outside electronic elements (e.g., power, signal trades, ground, and electronic components) using various features of the substrate. Those substrate features include, for example, conductive tracks, pads and other features formed (e.g., etched) from metal sheets and possibly laminated onto a non-conductive substrate. Wire bonds, which may include very thin (e.g., 30 micrometer in diameter) wires, or bumps connect the chip or device to bonding pads/areas on the substrate. A Ball Grid Array (BGA) is a type of package which uses solder balls or bumps to connect the package to outside electronic elements.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor package is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Applicant has determined conventional package technologies are largely coupled to planar substrates that include stiff cores. The packages are primarily deployed in the X-Y orientation along the planar substrate with less attention given to the Z dimension which is orthogonal to the planar substrate. As a result, conventional planar substrate-based technologies result in package systems that are stiff and consume a great deal of surface area in the X-Y orientation. Applicant has further determined that flexible PCB technology is overly limited as well. Flexible PCBs still require a relatively thick substrate of about 12 to 125 um in base material. The thickness limits the flexibility of the PCB and the PCB's ability to bend. Multi-layer circuits typically show a minimum bend radius of 20× thickness. Therefore, this limits the ability of the substrate to be rolled into a compact bundle that can fit into tight spaces (e.g., spaces less than 5 mm in thickness). If the substrate is rolled too tightly the brittle, rigid core of the substrate fractures and fails.

Figure 1A:
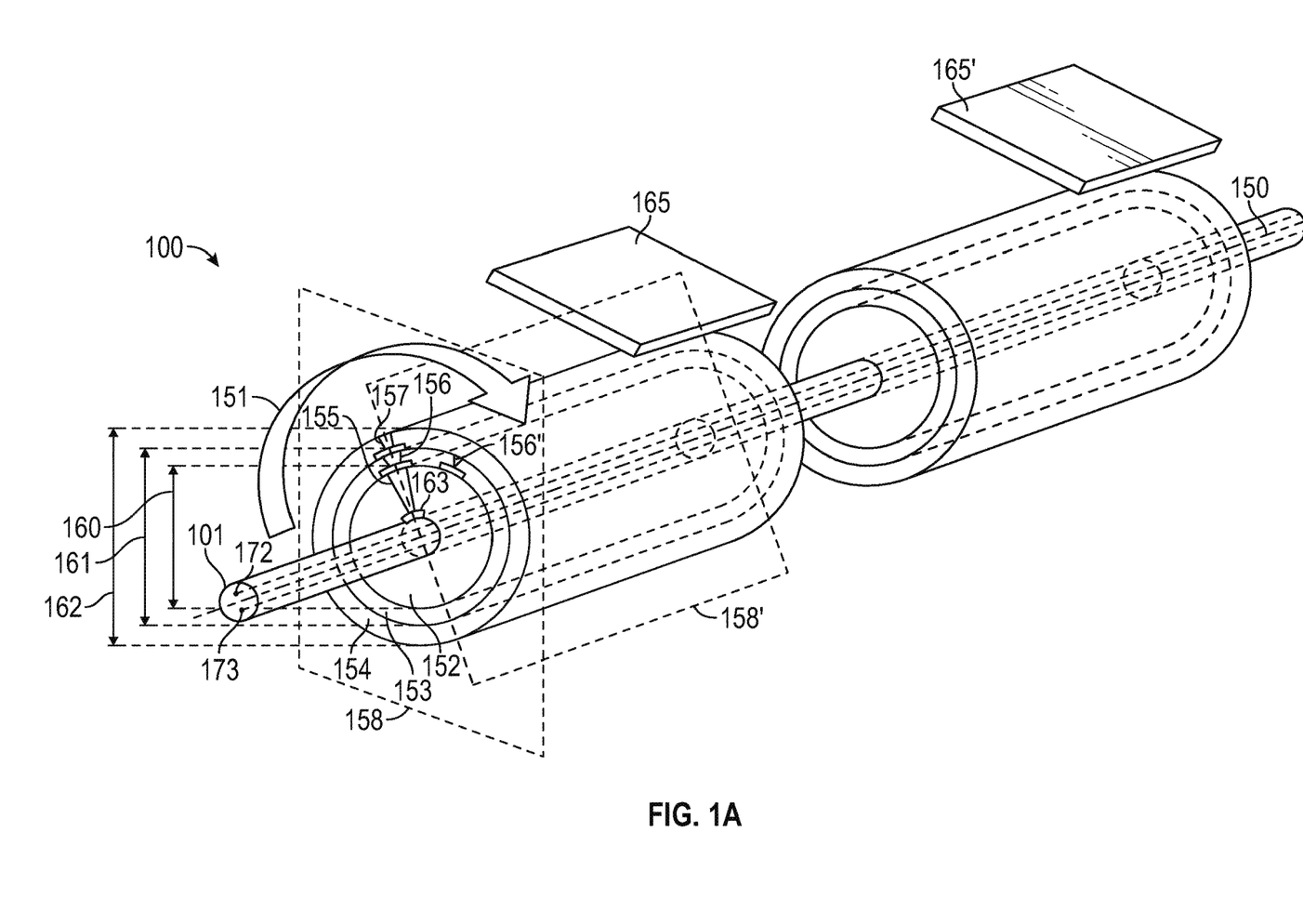
FIGS. 1A-B include a rounded core and buildup layers in an embodiment.
Figure 2:
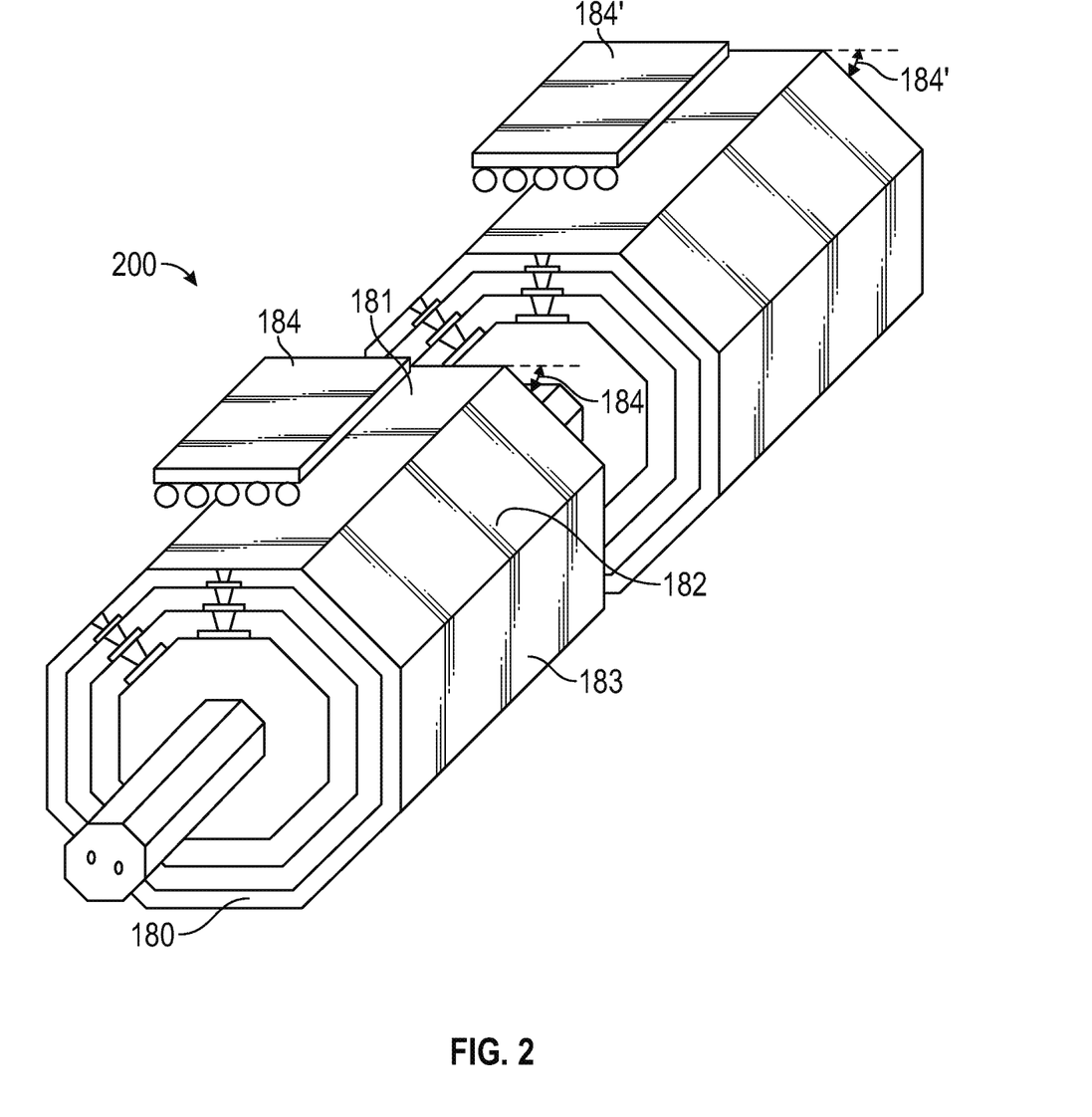
FIG. 2 includes a core with buildup layers that have planar faces in an embodiment.

In contrast, FIG. 1A provides a long (in the Z dimension as defined by axis 150), dense, thin structure with a curved profile. FIG. 2 provides a long, dense, thin structure with faces on multiple planes that are not necessarily directly opposite each other. Such embodiments are appropriate for form factors that are narrow.

Further, such embodiments are appropriate for use with System-in-Package (SIP) technologies. SIP systems include a number of integrated circuits enclosed in a single module (package). The SIP performs all or most of the functions of an electronic system. Dies containing integrated circuits may be stacked on a substrate and internally connected by wire bond or solder bumps. However, with embodiments described herein the dies may be placed along a rod-like substrate to thin the overall profile of the system.

Due to their narrow profile, these elongated embodiments are easily suitable for placement within, for example, writing utensils (e.g., smart pens), spectacles (e.g., within an arm of smart glasses), door hinges, virtual reality devices (e.g., virtual reality headset), and the like.

Regarding the methodology for providing a long, dense, thin structure with a curved profile, an embodiment includes using a cylindrical or polygonal rod structure as the core of the package. The core rotates about its long axis as build up layers are formed in concentric rings about the rod-shaped core. As a result, the area of each layer increases as the number of layer increases due to a larger radius for each subsequent layer. Such a rotating methodology is equally applicable to the embodiments of FIGS. 1A and 2 as well as other embodiments including rod-based substrates that provide an axis about which the layers may rotate during layer addition.

In an embodiment, build-up layers may be formed by rolling dielectric lamination layers onto the structure as the layer rotates about the elongated substrate core or as the substrate core rotates. In an embodiment, patterning of features (e.g., vias) may include electroless copper plating and a cylindrical/polygonal mask that envelops the whole substrate (i.e., surrounds the substrate in a plane orthogonal to a long axis of the core). Exposure of films can be achieved by, for example, (a) exposing the substrate to multiple surrounding light sources, and (b) rotating the substrate around its central core while exposing the system to one or more light sources. Once a first build up layer is formed subsequent build up layers may be formed utilizing the same methods used to form the first build up layer. The system may then be finished with the surface finishing.

Figure 1B:
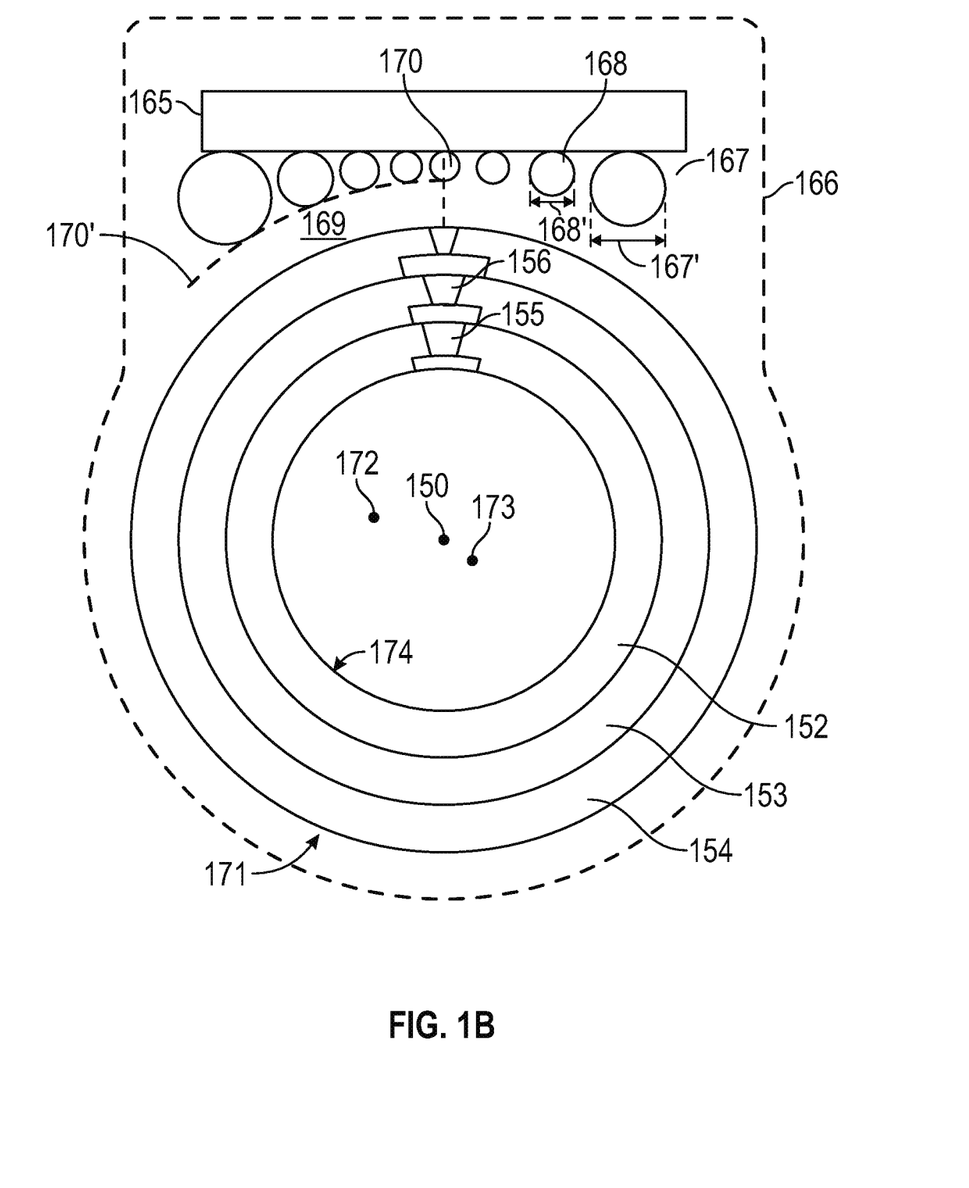
Figure 5:
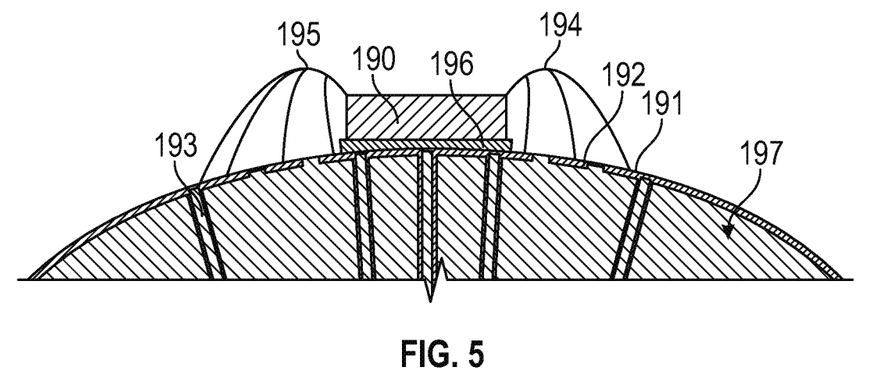
FIG. 5 depicts an embodiment that utilizes wire bonds to couple a die to a buildup layer.

As shown in FIG. 1B, a die may be mounted to the substrate using, for example, controlled collapse chip connection (C4) bumps. The bumps may be of varying size to connect a curved surface (e.g., FIG. 1B) or may be equally sized to interface a planar face (e.g., FIG. 2). Another method to enable a flat die/silicon attachment to a curved surface is through wire-bonding (FIG. 5). The back of the wirebonded die may be milled to include a curved shape in order to attach to a curved outer surface of the top most layer of the system.

Figure 3A:
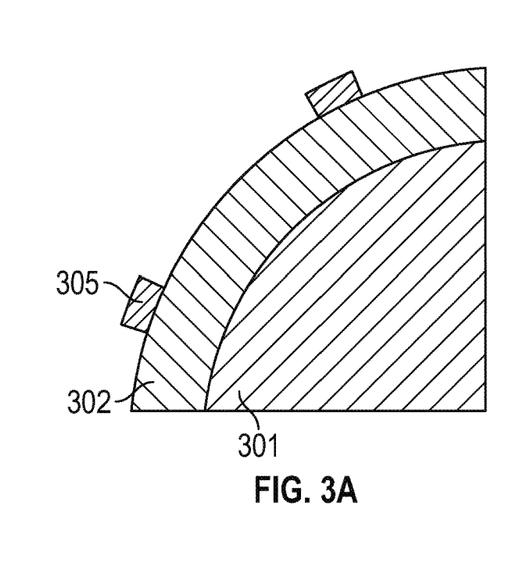
FIGS. 3A-3N depict a method in an embodiment.
Figure 3B:
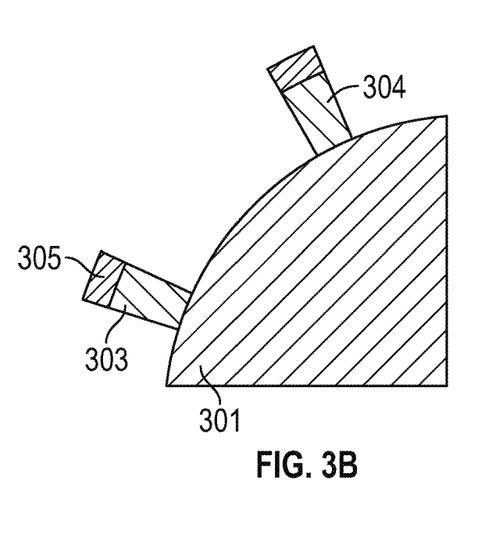
Figure 3C:
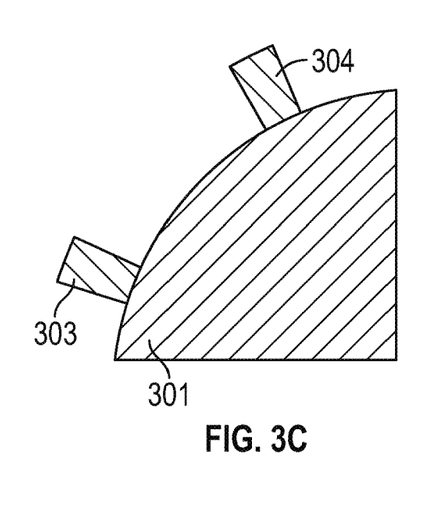
Figure 3D:
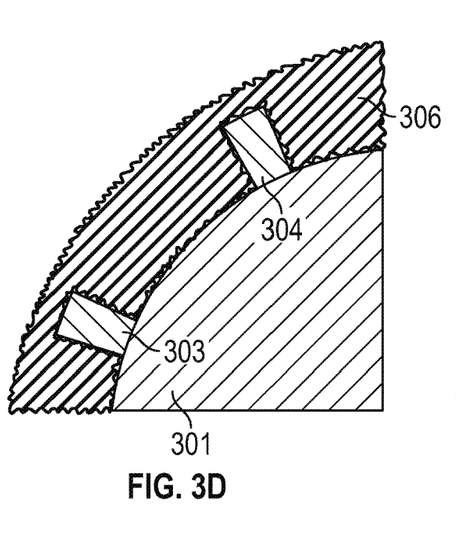
Figure 3E:
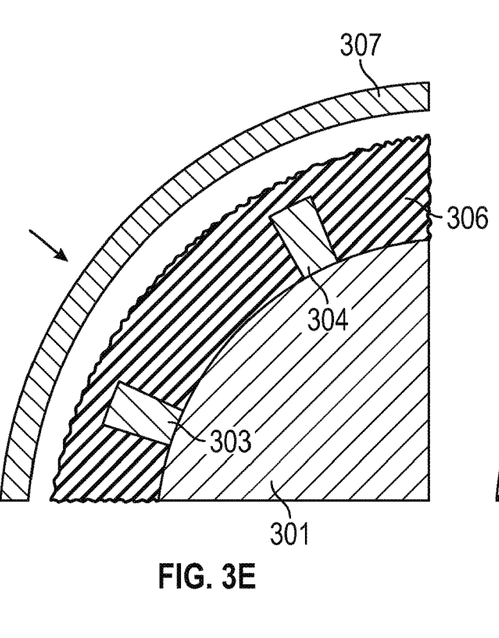
Figure 3F:
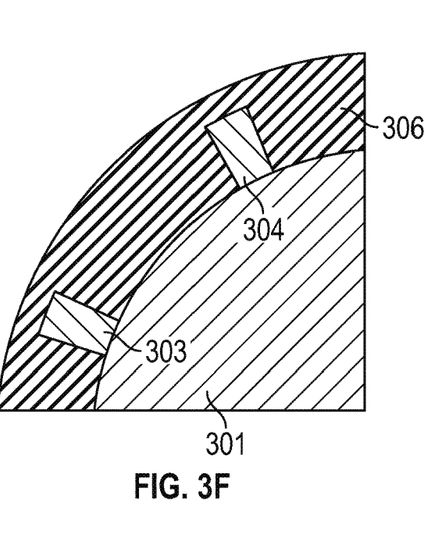
Figure 3G:
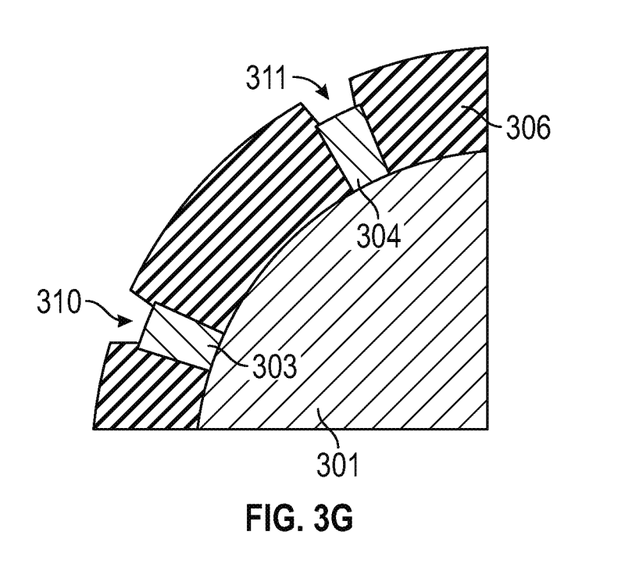
Figure 3H:
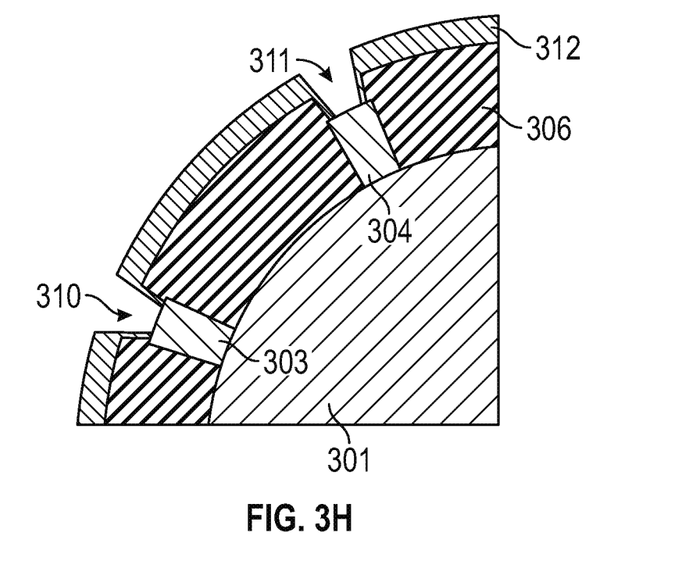
Figure 3I:
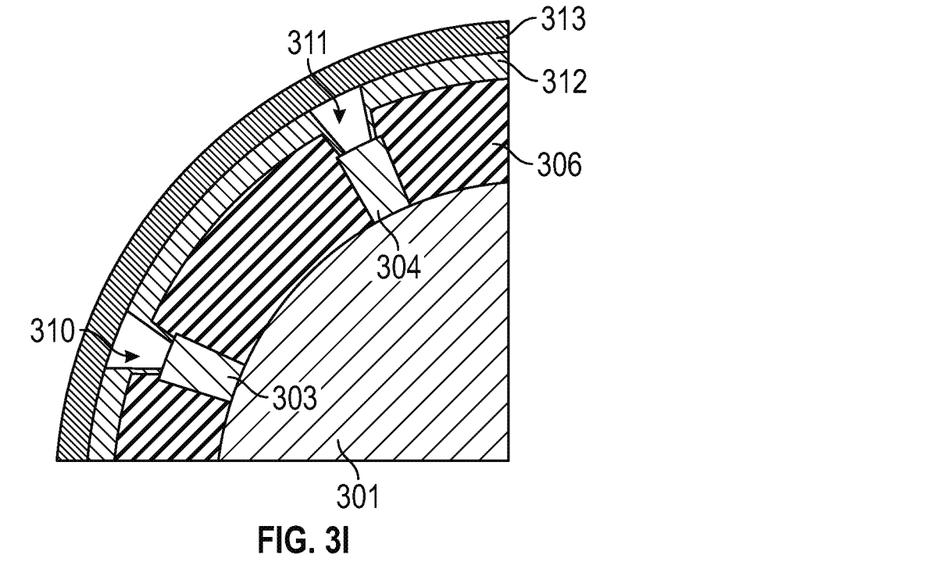
Figure 3J:
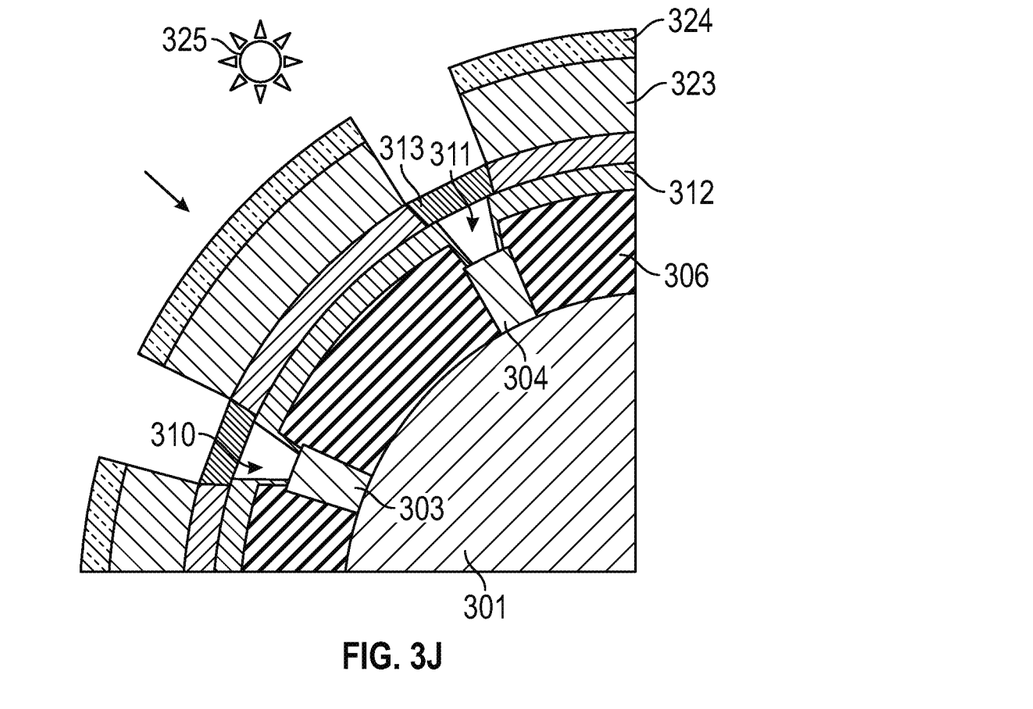
Figure 3K:
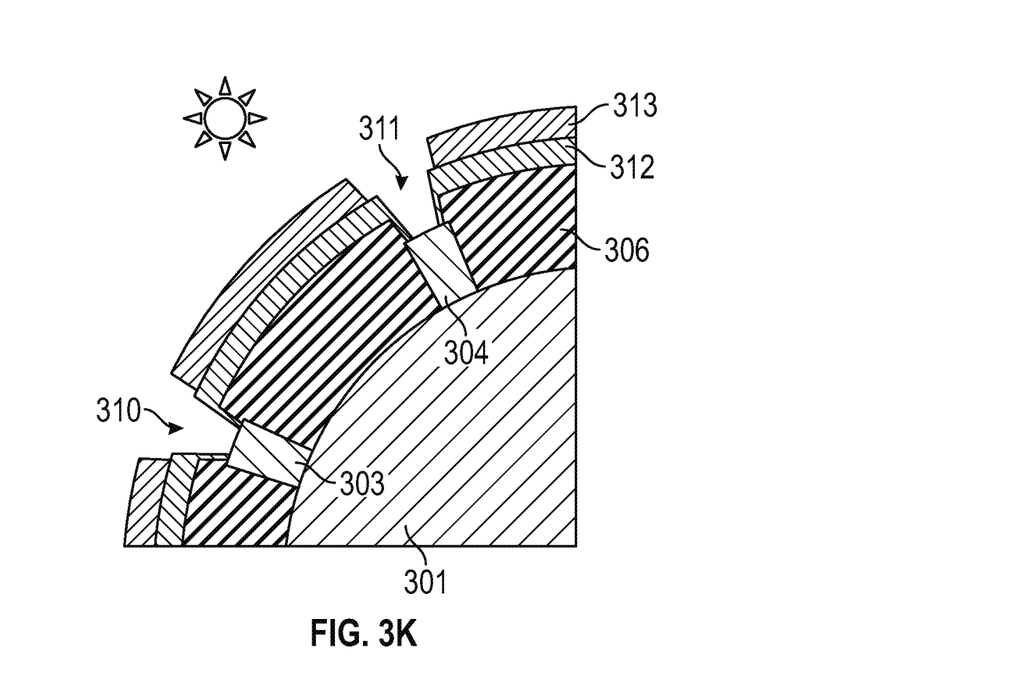
Figure 3L:
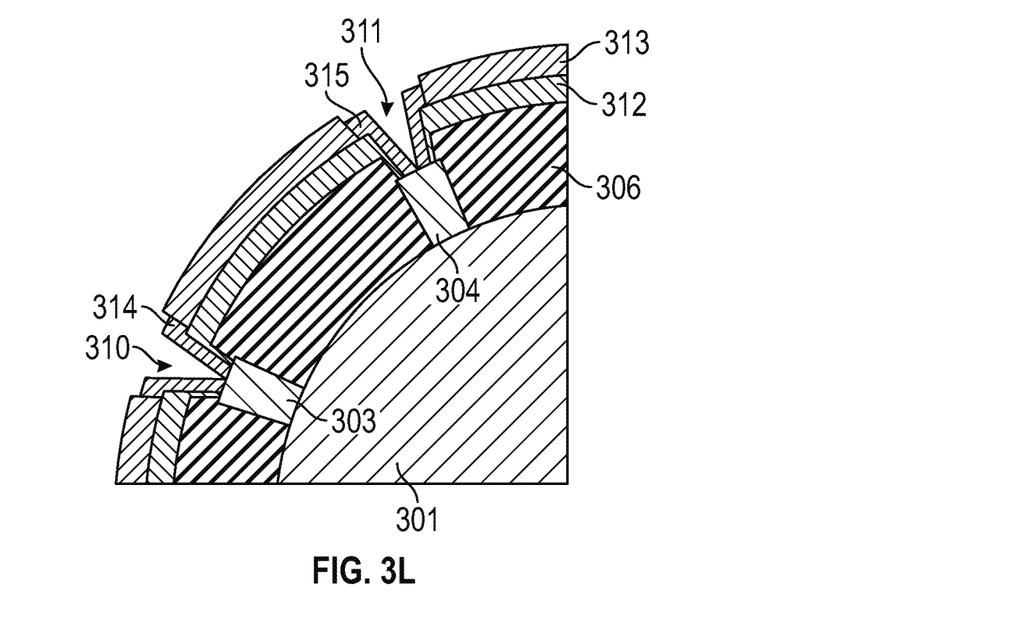
Figure 3M:
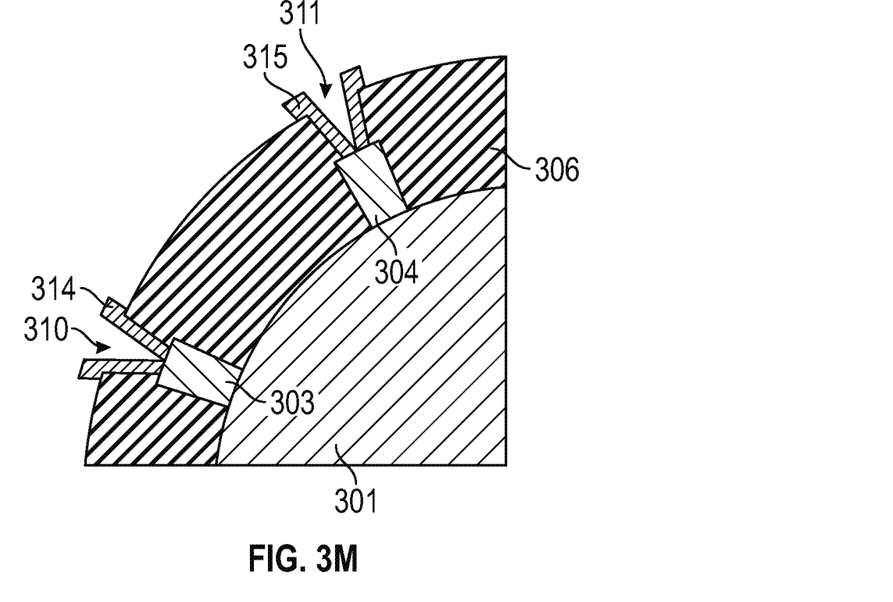
Figure 3N:
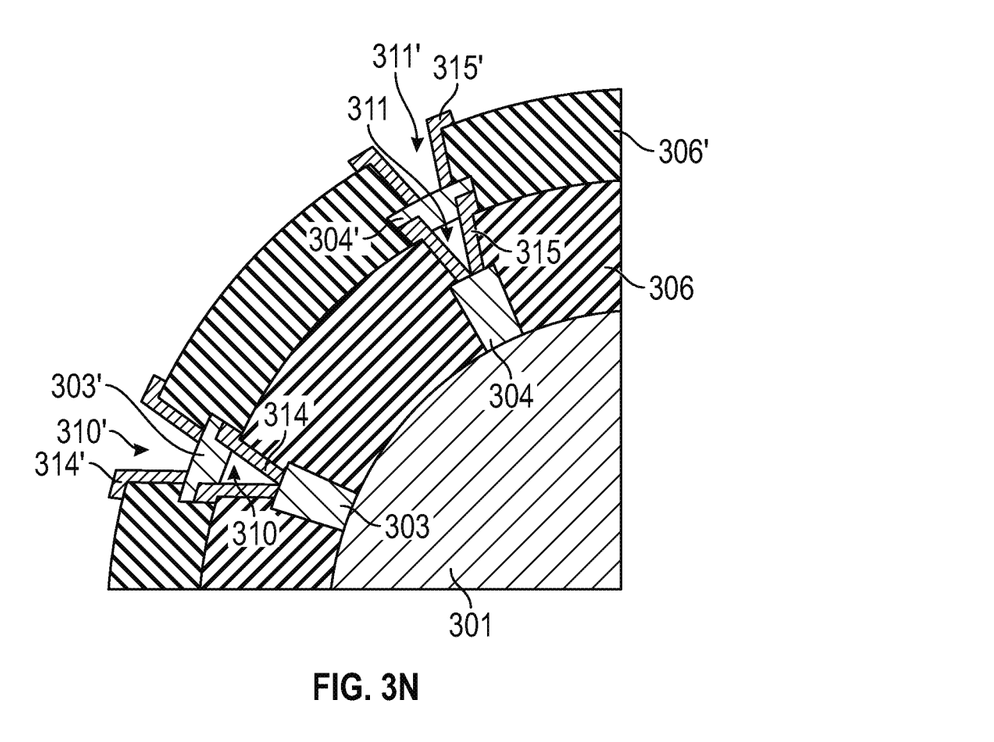
Figure 4:
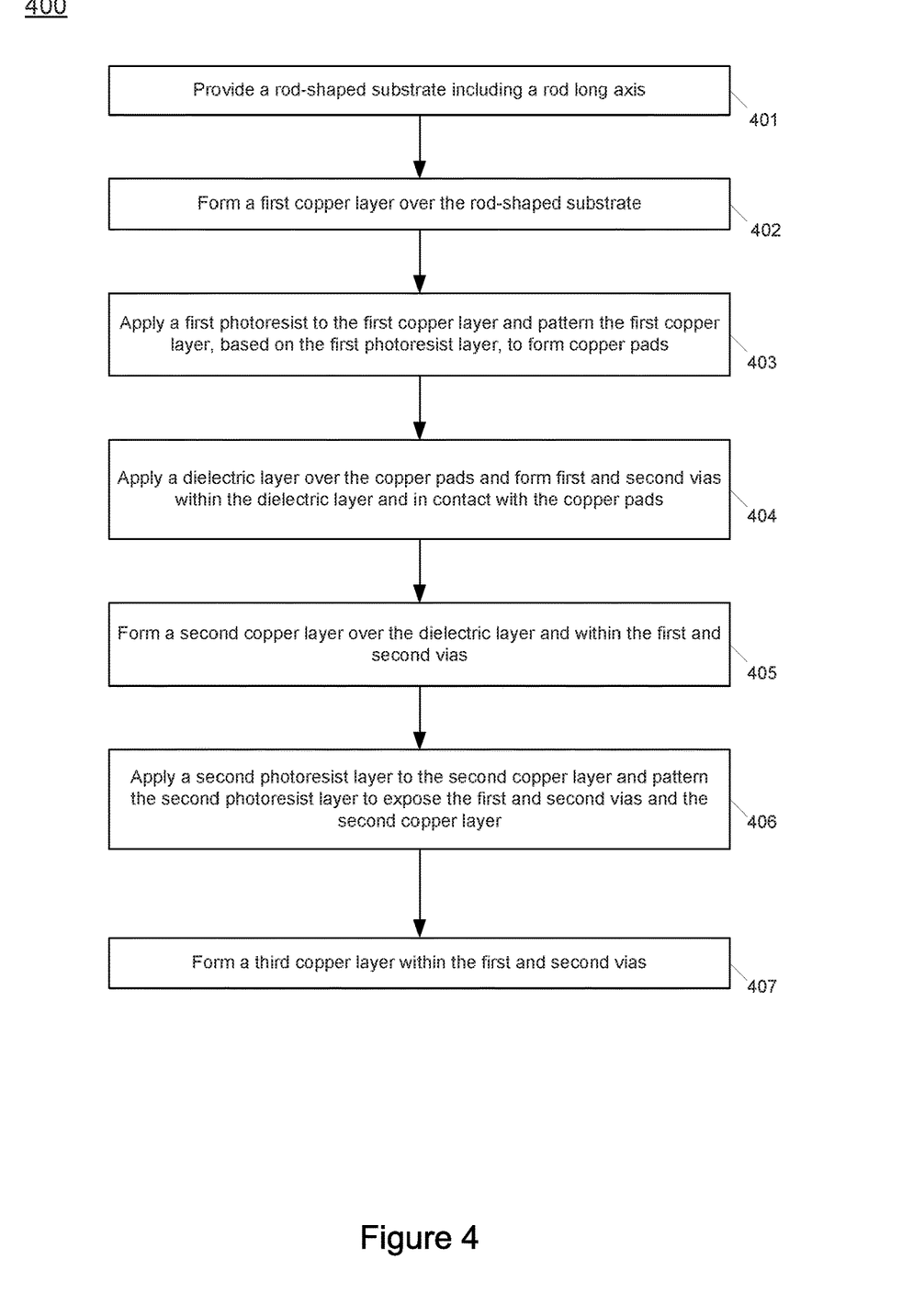
FIG. 4 depicts a method in an embodiment.

FIGS. 3A-3N and 4 are now addressed in detail. Methods described with regard to FIGS. 3A-3N and 4 may implement sequential buildup (SBU) methodologies in some embodiments.

Block 401 includes providing a rod-shaped substrate 301 (FIG. 3A). Block 402 includes forming a first copper layer 302 over the rod-shaped substrate 301 (FIG. 3A) (substrate 301 serves as the "core" in SBU based embodiments). Block 403 includes applying a first photoresist layer 305 (which may be a dry film) to the first copper layer 302 (FIG. 3A) and patterning (FIG. 3B) the first copper layer 302, based on the first photoresist layer 305, to form copper pads 303, 304 (FIG. 3C) and/or copper traces and the like. More specifically, FIGS. 3A-3C address core patterning. FIG. 3A depicts the removal of dry photoresist film that is not hardened leaving behind hardened film portions 305. FIG. 3B includes removing (e.g., etching) copper not protected by film portions 305. FIG. 3C includes removal of dry photoresist film.

Block 404 includes applying a dielectric layer 306 over the copper pads (FIG. 3D) and forming first and second vias 310, 311 (FIG. 3G) within the dielectric layer 306 and in contact with the copper pads 303, 304. More specifically, FIGS. 3D-3G address a first part of forming a first buildup layer. FIG. 3D includes provide an insulation film (a dielectric film), such as Ajinomoto Build-up Film (ABF), to the copper pads. FIG. 3E includes using a rubber and stainless steel press 307 to remove voids in layer 306 and flatten the outer surface of layer 306. FIG. 3F includes hardening layer 306 by heating layer 306 to cure layer 306. FIG. 3G includes forming vias 310, 311 with carbon dioxide laser treatment. Pads 303, 304 act as stops for the laser formation of the vias.

Block 405 includes forming a second copper layer 312 (e.g., electroless copper plating) over the dielectric layer 306 and within the first and second vias 310, 311 (FIG. 3H). Block 406 includes applying a second photoresist layer 313 to the second copper layer 312 (FIG. 3I). Block 406 further includes patterning the second photoresist layer 313, based on mask 324 and ultraviolet light 323, to expose the first and second vias 310, 311 and the second copper layer 312 (FIG. 3K). Block 407 includes forming a third copper layer 314, 315 (e.g., electrolytic copper plating) within the first and second vias 310, 311 (FIG. 3L). More specifically, FIGS. 3H-3N address patterning of the first buildup layer. FIG. 3H includes a desmearing stage that comprises roughening ABF film 306 and removing residue from the via bottoms. FIG. 3H also includes electroless copper plating. FIG. 3I includes applying photoresist dry film 313. FIG. 3J includes hardening parts of film 313 in response to ultraviolet light 323, mask 324, and ultraviolet light source 325. FIG. 3K includes removing unhardened portions of dry photoresist film 313. FIG. 3L includes electrolytic copper plating 314, 315 on previously applied electroless copper 312. FIG. 3M includes removal of dry film and electroless copper. FIG. 3M depicts a first buildup layer in SBU based embodiments. FIG. 3N includes the end result of forming a second buildup layer which is formed by repeating the procedure (not shown) addressed in FIGS. 3D-3M. Buildup layers provide a majority of signal wiring in the multilayered apparatus of FIG. 1A. Surface finishing (e.g., land formation to interact with C4 bumps and the like) may take place after FIG. 3N.

In an embodiment method 400 may include rotating the substrate 301 about the rod long axis (see rotation 151 about axis 150 in FIG. 1A) after forming the first via but before forming the second via. For example, a carbon dioxide laser may be static while substrate 301 rotates to from vias that do not align with each other in a plane parallel to axis 150. This rotation may occur in block 404.

In an embodiment method 400 may include rotating the substrate about the rod long axis (see rotation 151 about axis 150 in FIG. 1A) after beginning patterning the second photoresist layer (FIG. 3H) but before finishing patterning the second photoresist dielectric layer (FIG. 3M). For example, light source 325 may be static while substrate 301 rotates to expose areas of layer 313 that do not align with each other in a plane parallel to axis 150. This rotation may occur in block 407.

FIGS. 1A-B are now addressed in detail. Apparatus 100 comprises a rod-shaped substrate 101 including a rod long axis 150. A first layer 152 includes a first interconnect 155. Layer 152 substantially surrounds the substrate 101 in a first plane 158 that is orthogonal to the rod long axis 150. Apparatus 100 further includes a second layer 153, including a second interconnect 156, substantially surrounding the first layer in the first plane 158. Apparatus 100 further includes a third layer 154, including a third interconnect 157, substantially surrounding the first layer in the first plane 158.

First layer 152 may include several components. For example, layer 152 may include various vias which may include one or more layers (e.g., metal layers, adhesion layers, seed layers, and the like). The vias may be included within a material, such as a dielectric. The dielectric may be in the form of an insulative film. Such a film (e.g., ABF dry film) may be rolled onto substrate 101 (or a layer on substrate 101). There may be a seam where portions of the dry film (i.e., opposing ends of the film) meet one another. Other buildup layers may also include roll-on dielectric films that include seams. However, other layers (such as layer 312) may be formed with electroless methods or other such methods and leave no seam.

First layer 152 has a first maximum diameter 160 in the first plane 158. Second layer 153 includes a second maximum diameter 161, in the first plane 158, which is greater than the first maximum diameter 160. Third layer 154 includes a third maximum diameter 162 (which may be less than 5 mm in some embodiments), in the first plane 158, which is greater than the second maximum diameter 161.

First interconnect 155 is a via that couples to first copper pad 163 (which may be a trace or other interconnect in other embodiments). Via 155 includes a layer of copper along its inner walls (see FIG. 3M). In some embodiment, the via is filled with metal and in other embodiments the via merely has sidewalls lined with a metal. Embodiments are not limited to any one type of via or plated through hole (e.g., through hole, blind via, buried via) and instead include interconnects more generally that may be used to route signals, power, grounding and the like between packages, dies, and circuitry external to that depicted in FIG. 1A.

In an embodiment the first via 155 tapers inwards as it moves towards core 101. In other words, via 155 includes a first portion having a first width and a second portion having a second width that is less than the first width; and the second portion is between the first portion and the substrate 101.

An embodiment includes an additional interconnect, such as via 156'. Plane 158' is parallel to axis 150 and intersects axis 150 and the first via 155 but does not intersect the second via 156'. As described above, layers may rotate 151 about axis 150 during processing such that vias may be formed in different planes that are offset from each other by an angle of 10, 20, 30, 40, 50, 60, 70, 80, 90 degrees or more (with the angle being measured in plane 158). FIG. 1A depicts an embodiment where via 156' is offset about 30 degrees from via 156.

FIG. 1B includes a first package 166 comprising a die 165 (e.g., a processor and/or memory) configured to electronically couple to the first via. For example, die 165 may couple to via 157 by way of interconnect 170. Interconnect 170 may be a ball, bump, C4 bump, or any other interconnect (embodiments are applicable to BGA, land grid array (LGA), hybrid BGA/LGA, pin grid arrays, and the like). In the embodiment of FIG. 1B first interconnect bump 168 includes a first maximum width 168' and the second interconnect bump 167 includes a second maximum width 167' that is larger than the first maximum width 168'. The radius of curvature formed by arc 170' is complementary to the radius of curvature formed by the arc that defines the outer surface 171. For surfaces, the radius of curvature is the radius of a circle that best fits a normal section of the surface. Outermost buildup layer 154 has an outer surface 171 that is curvilinear. Further, the first layer 152 has an inner surface 174 that is curvilinear (a curved line) and includes a first radius of curvature (taken from axis 150) that is less than a second radius of curvature of the outer surface 171. Portion 169 may include a resin, adhesive, grease, underfill, thermal interface material (TIM), or heat transfer medium in general between die 165 and layer 154. FIG. 1B shows vias 155, 156 but does not show via 156' (FIG. 1A) of to maintain focus on other elements of FIG. 1B.

Returning to FIG. 1A, system or apparatus 100 may include a first chip or die 165 (in a first package that is not shown) and a second semiconductor chip or die 165' (in a second package that is not shown). A plane parallel to plane 158 may intersect the first chip 165 but not the second chip 165'. The two die may couple to each other electronically along paths 172 and/or 173 (which may carry signals, power, ground, and the like). Paths 172, 173 generally compose metal transmission lines (for signals, ground, or power) including a first long axis parallel to the rod long axis 150. These may be lines in some embodiments and/or planes in other embodiments. In other embodiments, the core can be manufactured to be solid. However, the embodiment of FIG. 1A shows multiple transmission line structures or power rails 172, 173 (which, in other embodiments, may be formed in concentric rings much like coaxial cable formations). In the embodiment of FIG. 1A the central core 101 can be used to not only provide mechanical strength but also as a pseudo inter-connect to attach multiple segments/packages/dies 165, 165' to each other.

Core 101 may include a semiconductive substrate. The core 101 may include an insulator to form a semiconductor on insulator (SOI) substrate. The core may be a laminate of several layers. The number of buildup layers: core layers may vary and include, for example, 3:1, 2:1, 1:1, 3:2, 2:2, 1:2, and the like. Core 101 may include vias, through hole vias (that extend fully across the substrate layer or layers), traces, voltage planes, and other interconnects.

FIG. 2 is similar to FIG. 1A but outermost layer 180 includes planar faces 181, 182, 183. The planes defined by faces 181, 182, 183 are not orthogonal to each other. For example, face 182 is approximately offset from face 181 by angle 184, which is approximately 45 degrees but may be other angles when structure 200 includes more or fewer faces than presently shown in FIG. 2. Die 184 may couple to outer layer 180 using evenly sized bumps.

FIG. 5 includes an embodiment with core 197. Die 190 couples to pads and/or vias 192, 193 and curvilinear outer buildup layer surface 191 by way of wire bonds 194, 195. Pad 196 couples die 190 to surface 191. Pad 196 may include a curvilinear surface complementary to surface 191. In other embodiments die 190 itself may include a curvilinear surface complementary to surface 191.

Thus, embodiments provide several advantages. First, embodiments are suitable for long narrow form factors. Second, embodiments may include a central core structure that provides stronger mechanical strength as compared to rolled up flexible PCB technologies. Third, dies may be mounted in orientations to one another that go beyond just being placed on opposing sides of a substrate and may be located at various locations along a 360 degree perimeter of the elongated, Z-oriented, substrate.

Figure 6:
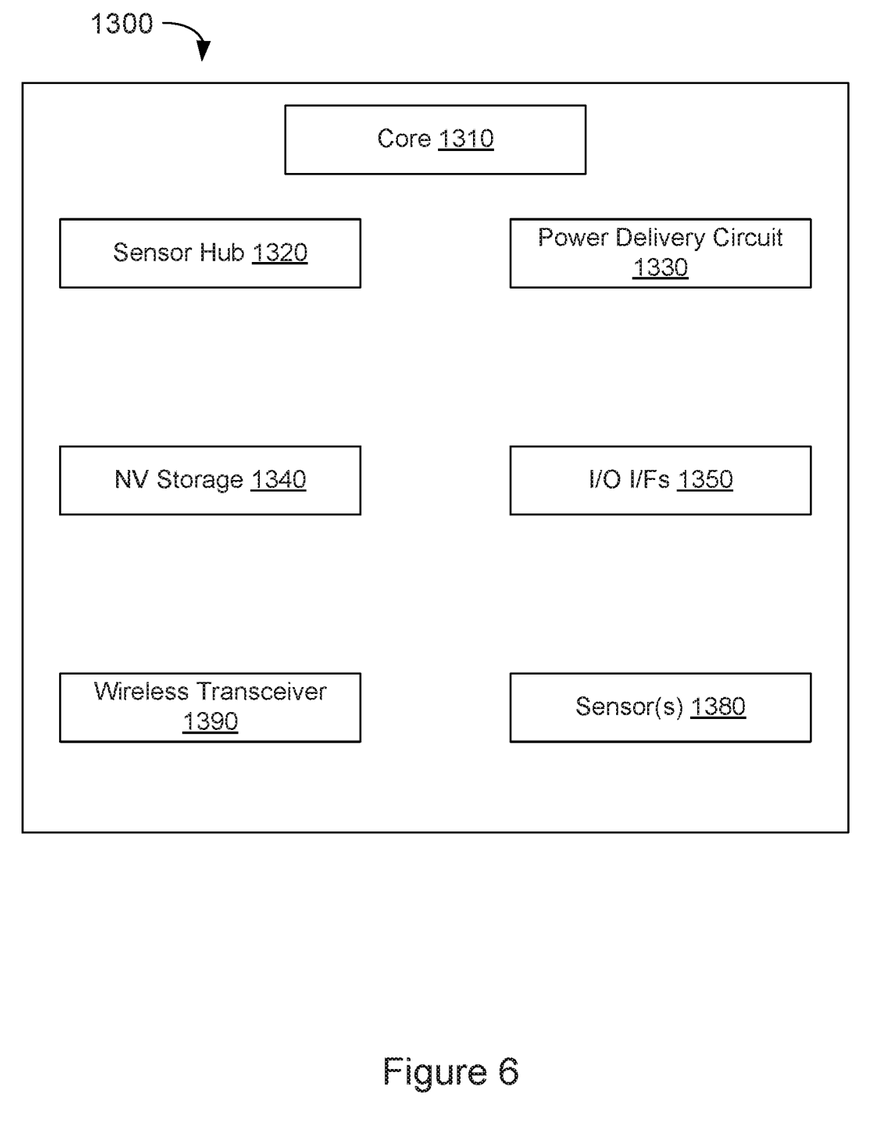
FIG. 6 includes a system that includes an embodiment.

Embodiments may be used in environments where devices may include wearable devices or other small form factor Internet of Things (IoT) devices. Referring now to FIG. 6, shown is a block diagram of a wearable module 1300. In one particular implementation, module 1300 may be an Intel® Curie™ module that includes multiple components adapted within a single small module that can be implemented as all or part of a wearable device. Such a module may be similar to module 166 of FIG. 1B. As seen, module 1300 includes a core 1310 (of course in other embodiments more than one core may be present). Such core may be a relatively low complexity in-order core, such as based on an Intel Architecture® Quark™ design. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340. In an embodiment, this circuit may include a rechargeable battery and a recharging circuit, which may in one embodiment receive charging power wirelessly. One or more input/output (TO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1a includes an apparatus comprising: a rod-shaped substrate including a rod long axis; a first layer, including a first interconnect, substantially surrounding the substrate in a first plane that is orthogonal to the rod long axis; and a second layer, including a second interconnect, substantially surrounding the first layer in the first plane.

A "first layer" as used herein does not necessarily mean no other layer is between the "first layer" and the substrate. For example, 1 or 2 buildup layers could be between the "first layer" and the core.

Example 2a includes the apparatus of example 1a, wherein: the first layer has a first maximum diameter in the first plane; and the second layer includes a second maximum diameter, in the first plane, which is greater than the first maximum diameter.

Example 3a includes the apparatus of example 1a wherein the first interconnect includes (a)(i) a first copper pad, and (a)(ii) a first via with a layer of copper along inner walls of the first via.

Another version of example 3a includes the apparatus of example 1a wherein the first interconnect includes (a)(i) a first copper trace, and (a)(ii) a first via with a layer of copper along inner walls of the first via.

Example 4a includes the apparatus of example 3a wherein: the first via includes first portion having a first width and a second portion having a second width that is less than the first width; and the second portion is between the first portion and the substrate.

Example 5a includes the apparatus of example 3a wherein: the second interconnect comprising a second via; and a plane that intersects the rod long axis and the first via does not intersect the second via.

Example 6a includes the apparatus of example 3a comprising a first package comprising a processor and memory and at least one of the processor and the memory are configured to electronically couple to the first via.

Example 7a includes the apparatus of example 6a wherein: the first package comprises first and second interconnect bumps; the first plane intersects the first and second interconnect bumps; and the first interconnect bump includes a first maximum width and the second interconnect bump includes a second maximum width that is larger than the first maximum width.

Example 8a includes the apparatus of example 6a wherein the first package comprises first and second wire bonds and the first wire bond is configured to electrically couple to the first via.

Example 9a includes the apparatus of example 3a comprising a semiconductor chip on the substrate, the semiconductor chip including an outer surface that is curvilinear.

Example 10a includes the apparatus of example 9a wherein the outer surface includes an arc in the first plane.

Example 11a includes the apparatus of example 3a comprising first and second semiconductor chips, wherein the first plane intersects the first chip but does not intersect the second chip.

Example 12a includes the apparatus of example 2a wherein the first layer includes an insulative film.

Example 13a includes the apparatus of example 12a wherein the insulative film includes a seam where two portions of the insulative film meet one another.

Example 14a includes the apparatus of example 1a wherein the second layer has an outer surface that is curvilinear.

Example 15a includes the apparatus of example 14a wherein the first layer has an inner surface that is curvilinear and includes a first radius of curvature that is less than a second radius of curvature of the outer surface of the second layer.

Example 16a includes the apparatus of example 1a wherein: the second layer includes a first planar face in a first face plane and a second planar face in a second face plane; the first face plane is not orthogonal to the second face plane; and the first face plane is not parallel to the second face plane.

Example 17a includes the apparatus of example 1a wherein the substrate includes a first metal transmission line including a first long axis parallel to the rod long axis.

Example 18a includes the apparatus of example 17a wherein: the substrate includes a second metal transmission line including a second long axis parallel to the rod long axis; the first metal transmission line is configured to transmit at least one of power and a signal and the second metal transmission line is configured to couple to ground.

Example 19a includes a method comprising: provide a rod-shaped substrate including a rod long axis; form a first copper layer over the rod-shaped substrate; apply a first photoresist layer to the first copper layer and pattern the first copper layer, based on the first photoresist layer, to form copper pads; apply a dielectric layer over the copper pads and form first and second vias within the dielectric layer and in contact with the copper pads; form a second copper layer over the dielectric layer and within the first and second vias; apply a second photoresist layer to the second copper layer and pattern the second photoresist layer to expose the first and second vias and the second copper layer; and form a third copper layer within the first and second vias.

Another version of Example 19a includes a method comprising: provide a rod-shaped substrate including a rod long axis; form a first copper layer over the rod-shaped substrate; apply a first photoresist layer to the first copper layer and pattern the first copper layer, based on the first photoresist layer, to form copper traces; apply a dielectric layer over the copper traces and form first and second vias within the dielectric layer and in contact with the copper traces; form a second copper layer over the dielectric layer and within the first and second vias; apply a second photoresist layer to the second copper layer and pattern the second photoresist layer to expose the first and second vias and the second copper layer; and form a third copper layer within the first and second vias.

Another version of Example 19a includes a method comprising: provide a rod-shaped substrate including a rod long axis; form a first copper layer over the rod-shaped substrate; apply a first photoresist layer to the first copper layer and pattern the first copper layer, based on the first photoresist layer, to form copper interconnects; apply a dielectric layer over the copper pads and form first and second vias within the dielectric layer and in contact with the copper interconnects; form a second copper layer over the dielectric layer and within the first and second vias; apply a second photoresist layer to the second copper layer and pattern the second photoresist layer to expose the first and second vias and the second copper layer; and form a third copper layer within the first and second vias.

Example 20a includes the method of example 19 comprising rotating the substrate about the rod long axis after forming the first via but before forming the second via.

In another embodiment the substrate may be static and manufacturing elements may rotate about the substrate. For example, a light source may rotate around the substrate to expose mask elements and the like. For example, a laser source may rotate around the substrate to form various vias around the core.

Example 21 includes the method of example 19 comprising rotating the substrate about the rod long axis after beginning patterning the second photoresist layer but before finishing patterning the second photoresist dielectric layer.

Example 22a includes the method of claim 19 wherein forming the second copper layer includes electroless copper plating and forming the third copper layer includes electrolytic copper plating.

Example 23a includes an apparatus comprising: a rod-shaped substrate including a rod long axis; a first layer, which includes a first via and first insulating material, substantially surrounding the substrate in a first plane that is orthogonal to the rod long axis; and a second layer, which includes a second via and second insulating material, substantially surrounding the first layer in the first plane.

Example 24a includes the apparatus of example 23a comprising a first package that couples to at least one of the first and second vias with at least one of: (a) two interconnect bumps that are differently sized from each other, and (b) two wire bonds.

Example 25a includes the apparatus of example 23a wherein: the second layer has a second outer surface that is curvilinear; and the first layer has a first outer surface that is curvilinear and includes a first radius of curvature that is less than a second radius of curvature of the second outer surface.

Example 26a includes a system comprising: a memory; and a processor coupled to the memory, wherein at least one of the processor and the memory couple to the first and second layers according to any one of examples 1a to 5a and 9a to 18a.

Example 27a includes the apparatus of any of examples 1 to 13 and 16 to 18 wherein the second layer has an outer surface that is curvilinear.

Example 28a includes the apparatus of any of examples 1 to 8 and 11 to 13 wherein: the second layer includes a first planar face in a first face plane and a second planar face in a second face plane; the first face plane is not orthogonal to the second face plane; and the first face plane is not parallel to the second face plane.

Example 29a includes the apparatus of any of examples 1 to 3 and 12 to 18 comprising a first package comprising a processor and memory and at least one of the processor and the memory are configured to electronically couple to the first via.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a rod-shaped substrate including a rod long axis;
   a first layer, including a first interconnect, substantially surrounding the substrate in a first plane that is orthogonal to the rod long axis; and
   a second layer, including a second interconnect, substantially surrounding the first layer in the first plane;
   wherein (a) the substrate includes a first metal transmission line including a first long axis substantially parallel to the rod long axis, and (b) the first layer substantially surrounds the first metal transmission line in the first plane.

2. The apparatus of claim 1, wherein:
   the first layer has a first maximum diameter in the first plane; and
   the second layer includes a second maximum diameter, in the first plane, which is greater than the first maximum diameter.

3. The apparatus of claim 1 wherein the first interconnect includes (a)(i) a first copper pad, and (a)(ii) a first via with a layer of copper along inner walls of the first via.

4. The apparatus of claim 3 wherein:
   the first via includes first portion having a first width and a second portion having a second width that is less than the first width; and
   the second portion is between the first portion and the substrate.

5. The apparatus of claim 3 wherein:
   the second interconnect comprises a second via; and
   a plane that intersects the rod long axis and the first via does not intersect the second via.

6. The apparatus of claim 3 comprising a first package comprising a processor and memory and at least one of the processor or the memory are configured to electronically couple to the first via.

7. The apparatus of claim 6 wherein:
   the first package comprises first and second interconnect bumps;
   the first plane intersects the first and second interconnect bumps; and
   the first interconnect bump includes a first maximum width and the second interconnect bump includes a second maximum width that is larger than the first maximum width.

8. The apparatus of claim 6 wherein the first package comprises first and second wire bonds and the first wire bond is configured to electrically couple to the first via.

9. The apparatus of claim 3 comprising a semiconductor chip on the substrate, the semiconductor chip including an outer surface that is curvilinear.

10. The apparatus of claim 9 wherein the outer surface includes an arc in the first plane.

11. The apparatus of claim 3 comprising first and second semiconductor chips, wherein the first plane intersects the first chip but does not intersect the second chip.

12. The apparatus of claim 2 wherein the first layer includes an insulative film.

13. The apparatus of claim 12 wherein the insulative film includes a seam where two portions of the insulative film meet one another.

14. The apparatus of claim 1 wherein the second layer has an outer surface that is curvilinear.

15. The apparatus of claim 14 wherein the first layer has an inner surface that is curvilinear and includes a first radius of curvature that is less than a second radius of curvature of the outer surface of the second layer.

16. The apparatus of claim 1 wherein:
the second layer includes a first planar face in a first face plane and a second planar face in a second face plane;
the first face plane is not orthogonal to the second face plane; and
the first face plane is not parallel to the second face plane.

17. The apparatus of claim 1 wherein:
the substrate includes a second metal transmission line including a second long axis parallel to the rod long axis;
the first metal transmission line is configured to transmit at least one of power, a signal, or combinations thereof and the second metal transmission line is configured to couple to ground.

18. A system comprising:
a memory; and
a processor coupled to the memory,
wherein at least one of the processor or the memory couple to the first and second layers according to claim 1.

19. The apparatus of claim 1 wherein the first metal transmission line is not included in the first layer.

20. The apparatus of claim 1 wherein:
the first layer includes a first insulating material; and
the second layer includes a second insulating material.

21. A method comprising:
provide a rod-shaped substrate including a rod long axis;
form a first copper layer over the rod-shaped substrate;
apply a first photoresist layer to the first copper layer and pattern the first copper layer, based on the first photoresist layer, to form copper interconnects;
apply a dielectric layer over the copper interconnects and form first and second vias within the dielectric layer and in contact with the copper interconnects;
form a second copper layer over the dielectric layer and within the first and second vias;
apply a second photoresist layer to the second copper layer and pattern the second photoresist layer to expose the first and second vias and the second copper layer; and
form a third copper layer within the first and second vias.

22. The method of claim 21 comprising rotating the substrate about the rod long axis after forming the first via but before forming the second via.

23. The method of claim 21 comprising:
rotating the substrate about the rod long axis after beginning patterning the second photoresist layer but before finishing patterning the second photoresist dielectric layer;
wherein forming the second copper layer includes electroless copper plating and forming the third copper layer includes electrolytic copper plating.

24. An apparatus comprising:
a rod-shaped substrate including a rod long axis;
a first layer, which includes a first via and first insulating material, substantially surrounding the substrate in a first plane that is orthogonal to the rod long axis; and
a second layer, which includes a second via and second insulating material, substantially surrounding the first layer in the first plane.

25. The apparatus of claim 24 comprising a first package that couples to at least one of the first or second vias with at least one of: (a) two interconnect bumps that are differently sized from each other, or (b) two wire bonds.

26. The apparatus of claim 24 wherein:
the second layer has a second outer surface that is curvilinear; and
the first layer has a first outer surface that is curvilinear and includes a first radius of curvature that is less than a second radius of curvature of the second outer surface.

* * * * *